(12) United States Patent
Mengad

(10) Patent No.: US 9,214,953 B1
(45) Date of Patent: Dec. 15, 2015

(54) GENERALIZED DATA WEIGHTED AVERAGING METHOD FOR EQUALLY WEIGHTED MULTI-BIT D/A ELEMENTS

(71) Applicant: Dialog Semiconductor (UK) Ltd., Reading (GB)

(72) Inventor: Zakaria Mengad, Edinburgh (GB)

(73) Assignee: Dialog Semiconductor (UK) Limited, Reading (GB)

( * ) Notice: Subject to any disclaimer, the term of this patent is extended or adjusted under 35 U.S.C. 154(b) by 0 days.

(21) Appl. No.: 14/479,804

(22) Filed: Sep. 8, 2014

(30) Foreign Application Priority Data

Sep. 5, 2014 (EP) ..................................... 14183790

(51) Int. Cl.
*H03M 1/66* (2006.01)
*H03M 3/00* (2006.01)

(52) U.S. Cl.
CPC . *H03M 3/50* (2013.01); *H03M 3/36* (2013.01)

(58) Field of Classification Search
CPC ......... H03M 3/50; H03M 3/36; H03M 3/502; H03M 1/34; H03M 1/66; H03M 1/74; H03M 1/068; H03M 1/0663; H03M 1/0682; H03M 1/806; H03M 1/808; H03M 1/685; H03M 1/747; H03M 7/165; H04L 27/363; H04L 27/2067
USPC ............................ 341/140–158; 375/285, 298
See application file for complete search history.

(56) References Cited

U.S. PATENT DOCUMENTS

| | | | |
|---|---|---|---|
| 6,583,742 B1 | 6/2003 | Hossack | |
| 6,703,956 B1 * | 3/2004 | Mueller | ................ H03M 1/682 341/136 |
| 7,068,201 B1 * | 6/2006 | Chou | .................. H03M 1/0602 341/144 |
| 7,079,063 B1 * | 7/2006 | Nguyen | ................ H03M 1/067 341/144 |
| 7,283,082 B1 * | 10/2007 | Kuyel | .................... H03M 1/682 341/145 |
| 7,307,568 B1 * | 12/2007 | Nhuyen | .............. H03M 1/0872 341/118 |
| 7,369,077 B2 * | 5/2008 | Carroll | ................ H03M 1/0695 341/144 |
| 7,541,961 B1 * | 6/2009 | Garg | ..................... H03K 17/007 341/155 |
| 7,586,429 B1 * | 9/2009 | Cerusa | ................ H03M 1/0673 341/118 |
| 7,688,236 B2 * | 3/2010 | Di Giandomenico | ... H03M 1/1033 341/120 |

(Continued)

OTHER PUBLICATIONS

"Multilevel Codes: Theoretical Concepts and Practical Design Rules," by Udo Wachsmann, et al., IEEE Transactions on Information Theory, vol. 45, No. 5, Jul. 1999, pp. 1361-1391.

(Continued)

*Primary Examiner* — Lam T Mai
(74) *Attorney, Agent, or Firm* — Saile Ackerman LLC; Stephen B. Ackerman; Billy Knowles

(57) ABSTRACT

A multi-level data weighted averaging circuit for inclusion in a multi-bit DAC circuit has a thermometer encoder that includes a binary to thermometer code conversion array configured for retaining or generating a multi-bit code representing an amplitude to be developed by each of the DAC element of the DAC circuit. The thermometer encoder is in communication with a multi-bit delta/sigma modulator to receive an oversampled binary coding representing an amplitude of a sampling of an analog signal. The oversampled binary coding is applied to an element selector to select the elements retaining or generating the element binary strings of bits of the multi-bit thermometer code. The multi-bit thermometer code is transferred to a rotational dynamic element matching circuit that rotationally selects order that the DAC elements are to receive each of the element binary strings of bits of the multi-bit thermometer code.

53 Claims, 11 Drawing Sheets

(56) References Cited

U.S. PATENT DOCUMENTS

| | | | |
|---|---|---|---|
| 7,733,257 B1 * | 6/2010 | Lee | H03M 1/682 341/144 |
| 7,777,658 B2 * | 8/2010 | Nguyen | H03M 1/0663 341/143 |
| 7,812,753 B1 * | 10/2010 | Myles | H03M 1/0665 341/144 |
| 8,085,177 B2 | 12/2011 | O'Donnell et al. | |
| 8,159,381 B2 * | 4/2012 | Parida | H03M 7/12 341/118 |
| 2002/0070887 A1 | 6/2002 | Brooks et al. | |
| 2010/0149012 A1 | 6/2010 | Nguyen et al. | |
| 2010/0245142 A1 | 9/2010 | Myles et al. | |
| 2011/0227629 A1 | 9/2011 | Chang et al. | |

OTHER PUBLICATIONS

European Search Report 14183790.6-1805, Mar. 18, 2015, Dialog Semiconductor (UK) Ltd.

"A parallel current-steering DAC architecture for flexible and improved performance," by R.A.T. Van Den Hoven et al., Nov. 18, 2005, XP055175075, pp. 217-222, Retrieved from the Internet: URL: http://citeseerx.ist.psu.edu/viewdoc/download?doi=10.1.1.93. 9438& rep=rep1&type=pdf.

* cited by examiner

FIG. 3

| DSM output | d1 | d2 | d3 | d4 | d5 | d6 | d7 | d8 |
|---|---|---|---|---|---|---|---|---|
| 8 | 1 | 1 | 1 | 1 | 1 | 1 | 1 | 1 |
| 7 | 1 | 1 | 1 | 1 | 1 | 1 | 1 | 0 |
| 6 | 1 | 1 | 1 | 1 | 1 | 1 | 0 | 0 |
| 5 | 1 | 1 | 1 | 1 | 1 | 0 | 0 | 0 |
| 4 | 1 | 1 | 1 | 1 | 0 | 0 | 0 | 0 |
| 3 | 1 | 1 | 1 | 0 | 0 | 0 | 0 | 0 |
| 2 | 1 | 1 | 0 | 0 | 0 | 0 | 0 | 0 |
| 1 | 1 | 0 | 0 | 0 | 0 | 0 | 0 | 0 |
| 0 | 0 | 0 | 0 | 0 | 0 | 0 | 0 | 0 |

FIG. 4

| DSM output | o1 | o2 | o3 | o4 | o5 | o6 | o7 | o8 |
|---|---|---|---|---|---|---|---|---|
| 1 | 1 | 0 | 0 | 0 | 0 | 0 | 0 | 0 |
| 2 | 0 | 1 | 1 | 0 | 0 | 0 | 0 | 0 |
| 1 | 0 | 0 | 0 | 1 | 0 | 1 | 1 | 0 |
| 3 | 0 | 0 | 1 | 0 | 1 | 0 | 0 | 1 |
| 4 | 1 | 0 | 0 | 1 | 0 | 1 | 0 | 0 |
| 1 | 0 | 1 | 0 | 1 | 1 | 1 | 1 | 1 |
| 5 | 1 | 0 | 1 | 0 | 1 | 1 | 1 | 1 |
| 6 | 0 | 1 | 0 | 0 | 0 | 0 | 0 | 0 |
| 1 | 0 | 0 | 0 | 0 | 0 | 0 | 0 | 1 |

| DSM output | d1 | d2 | d3 | d4 | d5 | d6 | d7 | d8 |
|---|---|---|---|---|---|---|---|---|
| 8  | 1  | 1  | 1  | 1  | 1  | 1  | 1  | 1  |
| 7  | 1  | 1  | 1  | 1  | 1  | 1  | 1  | 0  |
| 6  | 1  | 1  | 1  | 1  | 1  | 1  | 0  | 0  |
| 5  | 1  | 1  | 1  | 1  | 1  | 0  | 0  | 0  |
| 4  | 1  | 1  | 1  | 1  | 0  | 0  | 0  | 0  |
| 3  | 1  | 1  | 1  | 0  | 0  | 0  | 0  | 0  |
| 2  | 0  | 0  | 0  | 0  | 0  | 0  | 0  | 0  |
| 1  | 0  | 0  | 0  | 0  | 0  | 0  | 0  | 0  |
| 0  | 0  | 0  | 0  | 0  | 0  | 0  | 0  | 0  |
| -1 | 0  | 0  | 0  | 0  | 0  | 0  | 0  | -1 |
| -2 | 0  | 0  | 0  | 0  | -1 | -1 | -1 | -1 |
| -3 | 0  | 0  | -1 | -1 | -1 | -1 | -1 | -1 |
| -4 | 0  | -1 | -1 | -1 | -1 | -1 | -1 | -1 |
| -5 | 0  | -1 | -1 | -1 | -1 | -1 | -1 | -1 |
| -6 | 0  | -1 | -1 | -1 | -1 | -1 | -1 | -1 |
| -7 | 0  | -1 | -1 | -1 | -1 | -1 | -1 | -1 |
| -8 | -1 | -1 | -1 | -1 | -1 | -1 | -1 | -1 |

FIG. 9

| DSM output | d1 | d2 | d3 | d4 | d5 | d6 | d7 | d8 |
|---|---|---|---|---|---|---|---|---|
| 8 | 1 | 1 | 1 | 1 | 1 | 1 | 1 | 1 |
| 7 | 1 | 1 | 1 | 1 | 1 | 1 | 1 | 0 |
| 6 | 1 | 1 | 1 | 1 | 1 | 1 | 0 | 0 |
| 5 | 1 | 1 | 1 | 1 | 0 | 0 | 0 | 0 |
| 4 | 1 | 1 | 1 | 1 | 0 | 0 | 0 | 0 |
| 3 | 1 | 1 | 1 | 0 | 0 | 0 | 0 | 0 |
| 2 | 1 | 0 | 0 | 0 | 0 | 0 | 0 | 0 |
| 1 | 1 | 0 | 0 | 0 | 0 | 0 | 0 | 0 |
| 0 | 0 | 0 | 0 | 0 | 0 | 0 | 0 | 0 |
| -1 | 0 | 0 | 0 | 0 | 0 | 0 | 0 | -1 |
| -2 | 0 | 0 | 0 | 0 | 0 | 0 | -1 | -1 |
| -3 | 0 | 0 | 0 | 0 | 0 | -1 | -1 | -1 |
| -4 | 0 | 0 | 0 | 0 | -1 | -1 | -1 | -1 |
| -5 | 0 | -1 | -1 | -1 | -1 | -1 | -1 | -1 |
| -6 | -1 | -1 | -1 | -1 | -1 | -1 | -1 | -1 |
| -7 | -1 | -1 | -1 | -1 | -1 | -1 | -1 | -1 |
| -8 | -1 | -1 | -1 | -1 | -1 | -1 | -1 | -1 |
| -9 | -1 | -1 | -1 | -1 | -1 | -1 | -1 | -1 |
| -10 | -1 | -1 | -1 | -1 | -1 | -1 | -1 | -1 |
| -11 | -1 | -1 | -1 | -1 | -1 | -1 | -1 | -2 |
| -12 | -1 | -1 | -2 | -2 | -2 | -2 | -2 | -2 |
| -13 | -1 | -2 | -2 | -2 | -2 | -2 | -2 | -2 |
| -14 | -2 | -2 | -2 | -2 | -2 | -2 | -2 | -2 |
| -15 | -2 | -2 | -2 | -2 | -2 | -2 | -2 | -2 |
| -16 | -2 | -2 | -2 | -2 | -2 | -2 | -2 | -2 |

FIG. 10

180
GENERALIZED DATA WEIGHTED AVERAGING METHOD FOR EQUALLY WEIGHTED MULTI-BIT D/A ELEMENTS

TECHNICAL FIELD

This disclosure relates generally to structures for multi-bit delta/sigma modulators in multi-bit digital-to-analog converters. More particularly this disclosure relates dynamic element matching to eliminate differences among nominally identical circuit elements inevitably introduced during circuit fabrication that cause nonlinear distortion. Even more particularly, this disclosure relates to structures and methods for multi-bit data weighted averaging within a multi-bit delta/sigma digital-to-analog converter.

BACKGROUND

As is known in the art, oversampling has become popular in recent years for converting signals between analog and digital formats. Oversampling avoids the difficulties encountered with conventional analog-to-digital and digital-to-analog (ADC, DAC) conversion techniques employing relatively low sampling rates, typically the Nyquist rate of the signal. Conventional analog-to-digital and digital-to-analog techniques require very precise analog components in the filter and conversion circuits because of their vulnerability to noise and interference.

Conversely, oversampling ADC or DAC's are able to use relatively simple high-tolerance components to achieve high resolution. By sampling at much higher frequencies than the Nyquist rate of the signal the difficulties of the conventional analog-to-digital and digital-to-analog techniques are avoided. Oversampling ADC or DAC's permit simple and relatively high-tolerance analog components to achieve high resolution. However, fast and complex digital signal processing techniques are required to implement the filtering of the aliasing frequencies in ADC's.

FIG. 1 is a block diagram of an oversampling Delta/Sigma DAC of the related art. A digital data word 5 indicating an amplitude of a sampled analog signal is applied to an interpolation filter 7. The interpolation filter 7 up-samples the digital data word 5 to produce an approximation of the sequence that would have been obtained by sampling the signal at a higher frequency. The interpolation filter 7 creates a sequence of the digital data word 5 that comprises the original samples separated by zeros. A low pass filter smoothes out the discontinuities to replace the zeros with values that approximate the values of the digital data word 5 had the sampling frequency been an oversampling ratio times the original sampling frequency. The original digital data word 5 consists of a relatively large number of bits e.g. 24 bits determined by the sensitivity or the original analog-to-digital converter. The output of the interpolation filter is transferred to a Delta/Sigma modulator 10. The Delta/Sigma modulator 10 attenuates images due to the interpolation operation and band limits the signal at the output of the Delta/Sigma modulator 10 to the Nyquist frequency. The Delta/Sigma modulator 10 truncates the number of bits representing the signal e.g. to 3 bits to take advantage of both oversampling and noise shaping to keep the signal-to-noise ratio of the output signal of the Delta/Sigma modulator 10 as close as possible to signal-to-noise ratio of the oversampled input. The output of the Delta/Sigma modulator 10 is applied to a dynamic element matching circuit 20. As is known in the art, the differences in the layout design and manufacturing processes causes minor differences in the signal levels of each of the DAC elements 30a, 30b, ... 30n that causes spectral noise in the output signal. The dynamic element matching circuit 20 employs techniques such as barrel shifting, dithered data weighted averaging, incremental data weighted averaging, bi-directional data weighted averaging, partitioned data weighted averaging, rotated data weighted averaging, randomized data weighted averaging, or pseudo data weighted averaging for the selection of the DAC elements 30a, 30b, ... 30n, and noise shaping techniques to determine the analog signal 40.

Data weighted averaging is used to apply first order mismatch noise shaping to obviate the negative effects of mismatch errors such as noise and distortion between multiple DAC elements. Data weighted averaging is an element rotation process with objective to provide the long-term average use of each unit element of the DAC elements 30a, 30b, ... 30n to be identical. The pattern of usage of the DAC elements 30a, 30b, ... 30n is rotated such that the DAC elements 30a, 30b, ... 30n are selected sequentially.

A data weighted averaging circuit has a thermometer encoder that converts the data output of the Delta/Sigma modulator 10 to a thermometer code that selects the DAC element 30a, 30b, ... 30n that are to be summed together by the summation circuit 35 to generate the output analog signal 40. A pointer indicates which DAC element 30a, 30b, ... 30n that is used as the starting point for the digital to analog conversion. A shifter maps the relationship between the thermometer code and DAC element 30a, 30b, ... 30n.

The output of the dynamic element matching circuit 20 is applied to the input to the DAC elements 30a, 30b, ... 30n. The outputs of the DAC elements 30a, 30b, ... 30n are applied to the summation circuit 35 to determine the amplitude of the output analog signal 40.

Conventionally, the DAC elements 30a, 30b, ... 30n are usually one bit binary coded {+1,0}, meaning that each DAC elements 30a, 30b, ... 30n occupies only two (2) different output signal levels. In maximum precision digital-to-analog conversion, the number of DAC elements 30a, 30b, ... 30n becomes large and the structure of the summation circuit becomes very complex.

FIG. 2 is a block diagram of the Delta/Sigma DAC system of FIG. 1 illustrating the details of a single bit data weighted averaging circuit 20 of the related art. FIG. 3 is a table for the binary-to-thermometer code conversion of the binary-to-thermometer encoder 50 for a single bit encoding of the related art. The digital input 5 is applied to the Delta/Sigma modulator 10 as described above. The output 15 of the Delta/Sigma modulator 10 is applied to the thermometer encoder 50 of the dynamic element matching circuit 20. Referring to FIG. 3, the output 15 of the Delta/Sigma modulator 10 is a digital code that represented as an unsigned binary code that is used to address a conversion memory or logical circuit that determines each output based upon the unsigned binary code.

The output 55a, 55a, ..., 55n−1, 55n of the thermometer encoder 50 receives the thermometer code selected based on the unsigned binary code 15 applied to the input of the thermometer encoder 50. For example, if the unsigned binary code 15 is set to the binary equivalent of a 5, the outputs 55a, 55a, ..., 55n−1, 55n that are d1 through d5 are set to a logical 1 and the remaining outputs d6 through d8 are set to a logical zero. The output 55a, 55a, ..., 55n−1, 55n of the thermometer encoder 50 is applied to the input of the barrel shifter. The output 15 of the Delta/Sigma modulator 10 is applied to the input of an accumulator 65. The accumulator 65 determines the amount that the output 55a, 55a, ..., 55n−1, 55n of the thermometer encoder 50 is to be rotated by the barrel shifter 60 to provide the data weighted averaging of the DAC elements 30a, 30b, . . . 30n to minimize the negative effects of mismatch errors due process variations for each of the DAC elements 30a, 30b, . . . 30n.

U.S. Pat. No. 6,583,742 (Hossack) describes digital-to-analog converter (DAC) system that has multiple weighting elements. Some of the weighting elements have a different nominal weight from other elements. Pairs of elements with the same nominal weight are combined, with each pair of elements having more than two output states. A selection unit is coupled to the elements and an adder is coupled to the selection unit to sum the outputs of the weighted elements. In use, the DAC system receives a digital signal and the selection unit determines the output state of each element combination to provide values of the weighted elements which, when summed, are equivalent to the digital signal. The selection unit also determines the output state of each element in each element combination to minimise errors.

U.S. Pat. No. 7,079,063 (Nguyen, et al.) provides a system for processing digital signals in a data converter. The system includes a thermometer encoder for receiving signed binary data and for providing signed thermometer data. The signed thermometer data includes positive thermometer data and negative thermometer data. The system also includes a shuffler that receives positive input data responsive to the positive thermometer data and receives negative input data responsive to the negative thermometer data. The system also includes a decoder for receiving output data from the shuffler and providing decoded data to an analog output stage.

SUMMARY

An object of this disclosure is to provide a multi-level data weighted averaging circuit for inclusion in a DAC circuit that includes multi-level DAC elements.

Another object of this disclosure is to provide a thermometer encoder included in a multi-level data weighted averaging circuit encoding a multi-level quantizer signal from a delta/sigma modulator included in a DAC circuit.

Another object of this disclosure is to provide a thermometer encoder in which the design is dependent upon a number of integer levels generated by a delta/sigma modulator of the DAC circuit and the number of levels generated by the DAC elements of the DAC circuit.

To accomplish at least one of these objects, an exemplary thermometer encoder has a binary to thermometer code conversion array configured for retaining or generating a multi-bit code representing an amplitude to be developed by each of the DAC element of the DAC circuit. The thermometer encoder is in communication with a multi-bit delta/sigma modulator to receive an oversampled binary coding representing an amplitude of a sampling of an analog signal. The oversampled binary coding is applied to an element selector to select the elements retaining or generating the element binary strings of bits of the multi-bit thermometer code. The multi-bit thermometer code is transferred to a rotational dynamic element matching circuit that rotationally selects order that the DAC elements are to receive each of the element binary strings of bits of the multi-bit thermometer code.

The oversampled binary coding is structured to have sufficient bits to select a primary dimension of the array having a number of elements determined by the formula:

$$C = m*N*2^k$$

Where:
m is the number of bits in each binary word.
N is the number of the DAC elements.
k is the number of bits of the output of the Delta/Sigma modulator.

The number of outputs of the multi-bit thermometer encoder is equal to the number of DAC elements of the DAC circuit. Each of the inputs to each DAC element receives the number of bits within the element binary strings.

In some embodiments, the binary to thermometer code conversion array are memory cells retaining the value for each of the binary word in each of the rows of the row decoder. In various embodiments, the binary to thermometer code conversion array is formed of a static random access memory, a read-only memory array, or a programmable read only array. In other embodiments, the binary to thermometer code conversion array is formed of logic fulfilling the logic function to define the levels for each cell.

The binary words composed of the bits that are a binary coding of the level to be generated by the DAC elements is transferred to a column driver circuit. The column driver circuit conditions and amplifies binary words to form the multi-bit thermometer code that is transferred to DAC elements through the barrel shifter.

The contents of any row of the binary to thermometer code conversion array is determined by the formula:

$$MENC(X) = THENC(Y) + Q$$

Where:

$$X = Y + Q*N$$

MENC is contents of a row of the signed binary to thermometer code conversion array.
THENC is a one-bit (two level) thermometer encoder array as described in FIG. 3.
N is the number of DAC elements.
X is the numeric designation of a row of the binary to thermometer code conversion array.
Q is the quotient of the non-Euclidian division of X by N where the remainder is Y has the same sign as X.

The binary to thermometer code conversion array is assembled by repetitively executing the equation for filling each row of the binary to thermometer code conversion array.

In various embodiments, a DAC circuit accomplishes at least one of these objects. The DAC circuit includes a multi-bit Delta/Sigma modulator that receives a binary code representative of the amplitude of a sampled analog signal. The Delta/Sigma modulator increases the sampling frequency of the binary code and interpolates each sample of the oversampled frequency based on the values of the original sampled data. The interpolated and oversampled data is converted to an oversampled coding and transferred to a multi-bit thermometer encoder.

The multi-bit thermometer encoder has a binary to thermometer code conversion array configured for retaining or generating a multi-bit code representing an amplitude to be developed by each of the DAC element of the DAC circuit. The thermometer encoder is in communication with a multi-bit delta/sigma modulator to receive the oversampled binary coding. The oversampled binary coding is applied to an element selector or decoder to select the elements retaining or generating the element binary strings of bits of the multi-bit thermometer code. The multi-bit thermometer code is transferred to a rotational dynamic element matching circuit that rotationally selects order that the DAC elements are to receive each of the element binary strings of bits of the multi-bit thermometer code.

The oversampled binary coding is structured to have sufficient bits to select the elements of the array having a number of elements determined by the formula:

$$C=m*N*2^k$$

Where:
m is the number of bits in each binary word.
N is the number of the DAC elements.
k is the number of bits of the output of the Delta/Sigma modulator.

The number of outputs of the multi-bit thermometer encoder is equal to the number of DAC elements of the DAC circuit. Each of the inputs to each DAC element receives the number of bits within the element binary strings.

In some embodiments, the binary to thermometer code conversion array are memory cells retaining the value for each of the binary word in each of the rows of the row decoder. In various embodiments, the binary to thermometer code conversion array is formed of a static random access memory, a read-only memory array, or a programmable read only array. In other embodiments, the binary to thermometer code conversion array is formed of logic fulfilling the logic function to define the levels for each cell.

The binary words composed of the bits of that is a binary coding of the level to be generated by the DAC elements is transferred to a column driver circuit. The column driver circuit conditions and amplifies binary words to form the multi-bit thermometer code that is transferred to DAC elements through the barrel shifter.

The contents of any row of the binary to thermometer code conversion array is determined by the formula:

$$MENC(X)=THENC(Y)+Q$$

Where:

$$X=Y+Q*N$$

MENC is contents of a row of the signed binary to thermometer code conversion array.
THENC is a one-bit (two level) thermometer encoder array as described in FIG. 3.
N is the number of DAC elements.
X is the numeric designation of a row of the binary to thermometer code conversion array.
Q is the quotient of the non-Euclidian division of X by N where the remainder is Y has the same sign as X.

The binary to thermometer code conversion array is assembled by repetitively executing the equation for filling each row of the binary to thermometer code conversion array.

In various embodiments, a data weighted averaging circuit within a DAC circuit accomplishes at least one of these objects. The data weighted averaging circuit includes a multi-bit thermometer encoder and a rotational dynamic element matching circuit. The thermometer encoder has a binary to thermometer code conversion array configured for retaining or generating a multi-bit code representing an amplitude to be developed by each of the DAC element of the DAC circuit. The thermometer encoder is in communication with a multi-bit delta/sigma modulator to receive an oversampled binary coding representing an amplitude of a sampling of an analog signal. The oversampled binary coding is applied to an element selector to select the elements retaining or generating the element binary strings of bits of the multi-bit thermometer code. The multi-bit thermometer code is transferred to the rotational dynamic element matching circuit that rotationally selects the order that the DAC elements are to receive each of the element binary strings of bits of the multi-bit thermometer code.

The oversampled binary coding is structured to have sufficient bits to select the elements of the array having a number of elements determined by the formula:

$$C=m*N*2^k$$

Where:
m is the number of bits in each binary word.
N is the number of the DAC elements.
k is the number of bits of the output of the Delta/Sigma modulator.

The number of outputs of the multi-bit thermometer encoder is equal to the number of DAC elements of the DAC circuit. Each of the inputs to each DAC element receives the number of bits within the element binary strings.

In some embodiments, the binary to thermometer code conversion array are memory cells retaining the value for each of the binary word in each of the rows of the row decoder. In various embodiments, the binary to thermometer code conversion array is formed of a static random access memory, a read-only memory array, or a programmable read only array. In other embodiments, the binary to thermometer code conversion array is formed of logic fulfilling the logic function to define the levels for each cell.

The binary words composed of the bits of that is a binary coding of the level to be generated by the DAC elements is transferred to a column driver circuit. The column driver circuit conditions and amplifies binary words to form the multi-bit thermometer code that is transferred to DAC elements through the barrel shifter.

The contents of any row of the binary to thermometer code conversion array is determined by the formula:

$$MENC(X)=THENC(Y)+Q$$

Where:

$$X=Y+Q*N$$

MENC is contents of a row of the signed binary to thermometer code conversion array.
THENC is a one-bit (two level) thermometer encoder array as described in FIG. 3.
N is the number of DAC elements.
X is the numeric designation of a row of the binary to thermometer code conversion array.
Q is the quotient of the non-Euclidian division of X by N where the remainder is Y has the same sign as X.

The binary to thermometer code conversion array is assembled by repetitively executing the equation for filling each row of the binary to thermometer code conversion array.

The rotational dynamic element matching circuit includes a pointer generator and a shifter. The pointer generator generates the rotation pointer indicating where each of the element binary strings of bits of the multi-bit thermometer code should be rotated during the next clock cycle. The pointer generator transfers the rotation pointer to the shifter and the shifter rotates each element binary string to the proper position based on shifting of the previous oversampled binary code.

In various embodiments, a method for data weighted averaging binary data samples representing an analog signal during a digital-to-analog conversion accomplishes at least one of these objects. A binary code representative of the amplitude of a sampled analog signal is Delta/Sigma modulated by increasing the sampling frequency of the binary code and interpolating each data sample of the oversampled data based on the values of the original sampled data. The number of bits of oversampled binary data are truncated. The oversampled binary data is then converted to a multi-bit thermometer code.

The multi-bit thermometer code is converted from the oversampled binary data. The conversions is accomplished by applying the oversampled binary data to a conversion table having one dimension of the table defined by the range of the oversampled binary data and a second dimension of the table defined by the number of digital-to-analog conversion elements. The number of levels of conversion that the digital-to-analog conversion elements perform defines the modulus of the conversion.

The multi-bit thermometer code is then rotated such that the code is applied to digital-to-analog conversion elements to perform a rotational dynamic element matching to apply first order mismatch noise shaping to obviate the negative effects of mismatch errors such as noise and distortion between multiple digital-to-analog conversion elements. The rotated multi-bit thermometer code is transferred to the digital-to-analog conversion elements to generate the analog signal indicated by the data sample. In various embodiments, rotating the multi-bit thermometer code is a barrel shifting of the multi-bit code elements, dithered data weighted averaging, a incremental data weighted averaging, a bi-directional data weighted averaging, a partitioned data weighted averaging, a rotated data weighted averaging, a randomized data weighted averaging, a pseudo data weighted averaging, or any other rotational dynamic element matching circuits configured for reducing inherent data weighted averaging tonal behaviour.

In various embodiments, a non-transitory computer processor readable medium having stored thereon a program of instructions executable by the computer processor to perform a method for data weighted averaging binary data samples representing an analog signal during a digital-to-analog conversion accomplishes at least one of these objects.

BRIEF DESCRIPTION OF THE DRAWINGS

FIG. 3 is a table of a binary-to-thermometer encoding for a single bit encoding of the related art.

FIG. 4 is a table of the output of the barrel shifter of FIG. 2 illustrating the rotation of the DAC elements of the related art.

FIG. 9 is a table of a binary-to-thermometer encoding for a tri-level bit encoding embodying the principles of the present disclosure.

FIG. 10 is a table of a binary-to-thermometer encoding for a five level bit encoding embodying the principles of the present disclosure.

DETAILED DESCRIPTION

Figure 1:
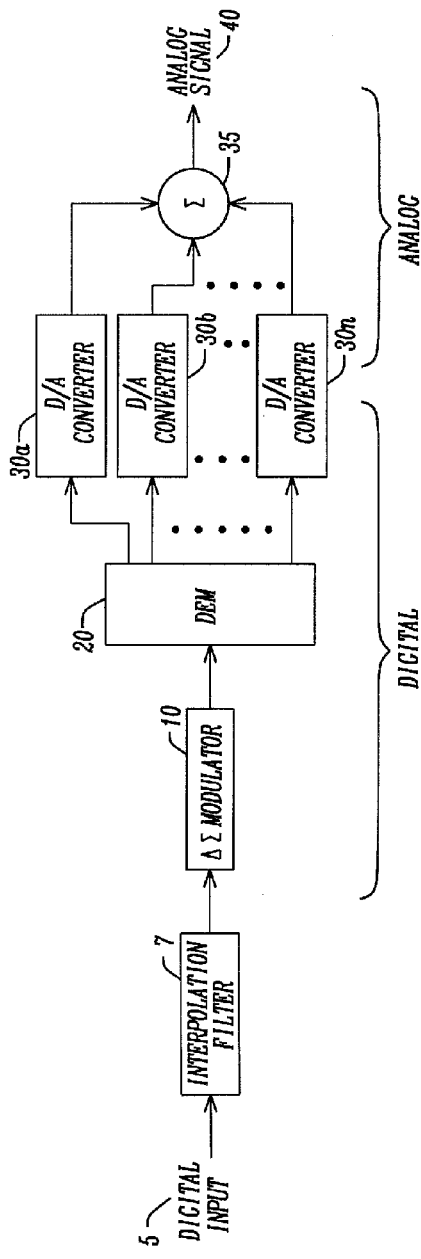
FIG. 1 is a block diagram of a Delta/Sigma DAC system of the related art.
Figure 2:
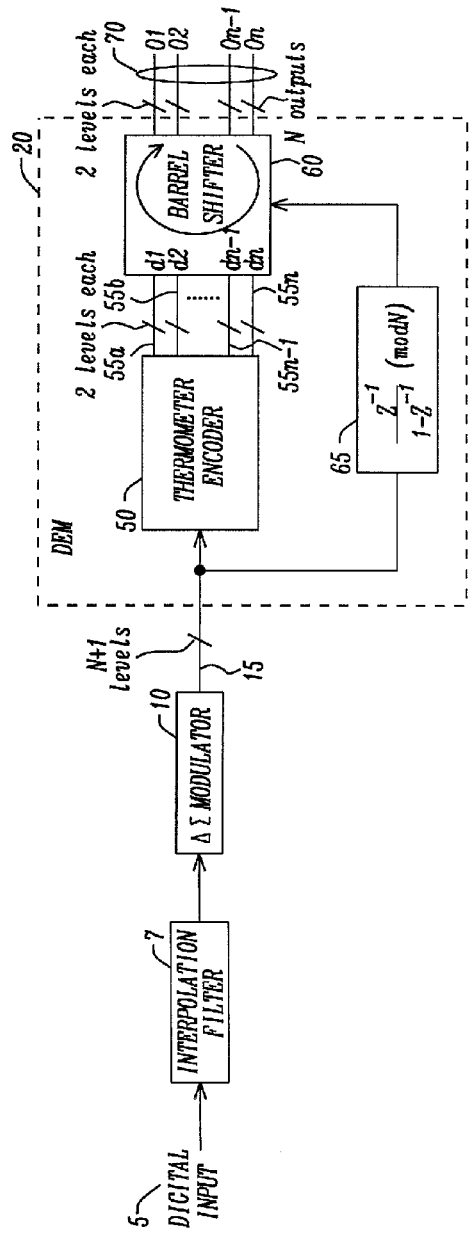
FIG. 2 is a block diagram of the Delta/Sigma DAC system of FIG. 1 illustrating the details of a single bit data weighted averaging circuit of the related art.
Figure 5:
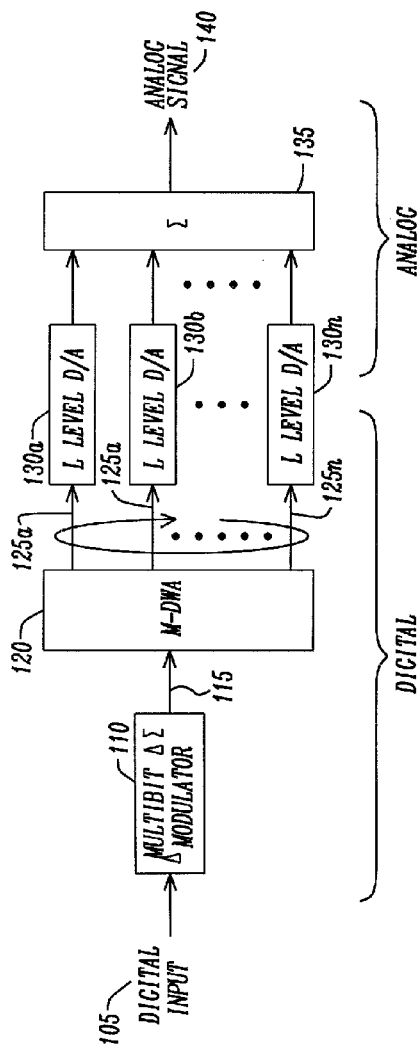
FIG. 5 is a block diagram of a Delta/Sigma DAC system embodying the principles of the present disclosure.
Figure 6:
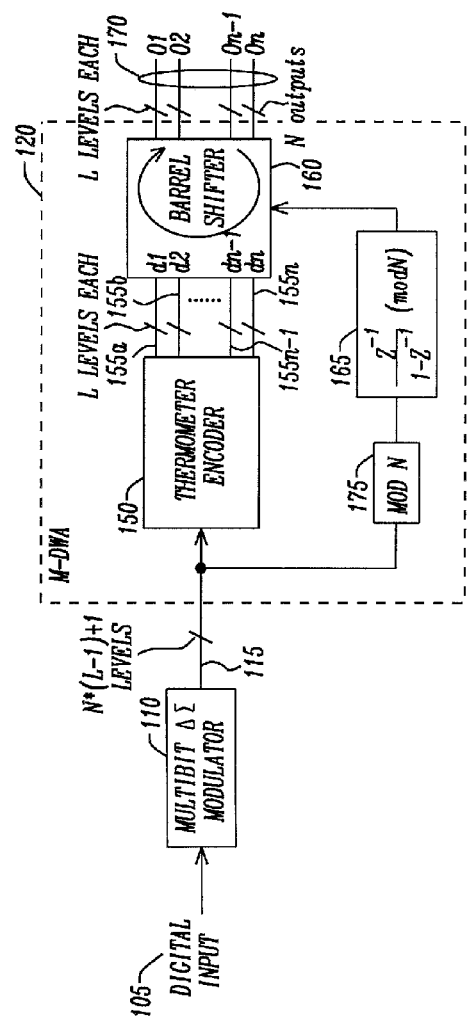
FIG. 6 is a block diagram of a Delta/Sigma DAC system illustrating the details of a multi-bit bit data weighted averaging circuit embodying the principles of the present disclosure.

FIG. 5 is a block diagram of a Delta/Sigma DAC system embodying the principles of the present disclosure. FIG. 6 is a block diagram of a Delta/Sigma DAC system illustrating the details of a multi-bit bit data weighted averaging circuit 120 embodying the principles of the present disclosure. An oversampled digital-to-analog converter has a digital word 105 representing an analog signal amplitude as an input. The digital word 105 is applied to an oversampling Delta/Sigma modulator 110. Delta/Sigma modulator 110 increases the sampling frequency and then interpolates the values of the amplitude of the input signal between the two original sampling times to generate an oversampled binary code 115. The Delta/Sigma modulated oversampled binary code 115 is then applied to a multi-bit data weighted averaging circuit 120 that mitigates the effects of the differences in the layout design and manufacturing processes that cause minor differences in the signal levels of each of the DAC elements 130a, 130b, . . . , 130n that cause spectral noise in the output signal. In multi-bit digital-to-analog conversion systems, a multi-bit input word 125a, 125b, . . . , 125n is transmitted from the multi-bit data weighted averaging circuit 120 to the DAC elements 130a, 130b, . . . , 130n. The analog output signals of the individual DAC elements 130a, 130b, . . . , 130n are the inputs to the summation circuit 135. The analog output signals of the individual DAC elements 130a, 130b, . . . , 130n an additively combined to determine the analog output signal 140.

Referring to FIG. 6, the multi-bit data weighted averaging circuit 120 includes a signed binary to thermometer encoder 150. In various embodiments, the thermometer encoder 150 has a decoding mechanism that receives the oversampled binary code 115 and transforms the oversampled binary code 115 to select one row of a binary to thermometer code conversion array.

Figure 7:
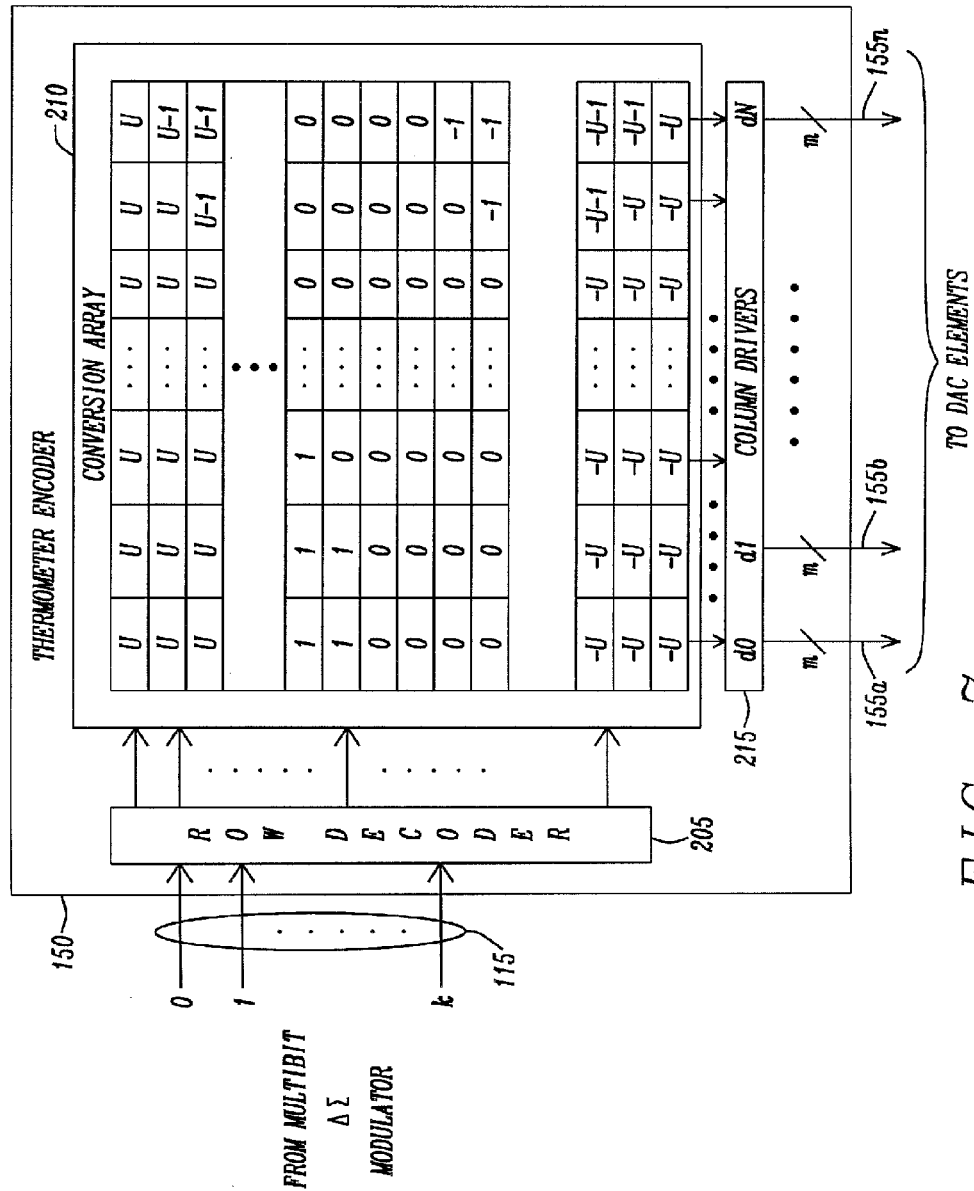
FIG. 7 is a block diagram of a binary-to-thermometer encoder within a multi-bit bit data weighted averaging circuit embodying the principles of the present disclosure as shown in FIG. 6.

FIG. 7 is a block diagram of the binary-to-thermometer encoder 150 within the multi-bit bit data weighted averaging circuit 120 as shown in FIG. 6. The output 115 of the Delta/Sigma modulator 110 is the input to the row decoder 205 of the thermometer encoder 150. The output is of row decoder 205 is the input to the binary to thermometer code conversion array 210. The row decoder 205 converts the binary input 115 to select one of the $2^k$ outputs of the row decoder 205. The one activated signal of the output of the row decoder 205 chooses one row of the binary to thermometer code conversion array 210. Each row of the binary to thermometer code conversion array 210 has a number of cells based on the number of DAC elements 130a, 130b, . . . , 130n of FIG. 6. The number of levels L available in each of the DAC elements 130a, 130b, . . . , 130n are encoded as a binary word d0, d1, . . . , dn. The amplitude illustrated ranges from +U to a −U where the number of levels L is determined by the formula:

$$L=2*U+1$$

Where:
L is the number of conversion levels for each of the DAC elements 130a, 130b, . . . , 130n.

Each of the binary words d0, d1, . . . , dn of a selected row of the row decoder 205 is the input to one of the DAC elements 130a, 130b, . . . , 130n. The number of bits in each binary word d0, d1, . . . , dn is determined by the equation: $m=\ln_2 L$. Therefore the number of cells C in the binary to thermometer code conversion array 210 is determined by the equation:

$$C=m*N*2^k \qquad \text{Eq. 1}$$

Where:
m is the number of bits in each binary word d0, d1, . . . , dn such that $m=\ln_2(2U+1)$ where U is the maximum level, plus and minus, of the DAC elements 130a, 130b, . . . , 130n.

N is the number of the DAC elements 130a, 130b, . . . , 130n.

k is the number of bits of the output of the Delta/Sigma modulator 110.

In some embodiments, the binary to thermometer code conversion array 210 are memory cells retaining the value for each of the binary word d0, d1, . . . dn in each of the rows of the row decoder 205. In various embodiments, the binary to thermometer code conversion array 210 is formed of a static random access memory, a read-only memory array, or a programmable read only array. In other embodiments, the binary to thermometer code conversion array 210 is formed of logic fulfilling the logic function to define the levels for each cell.

The binary words d0, d1, . . . , dn composed of the bits that are a binary coding of the level to be generated by the DAC elements 130a, 130b, . . . , 130n is transferred to a column driver circuit 215. The column driver circuit 215 conditions and amplifies binary words d0, d1, . . . dn to form the multi-bit thermometer code 155a, 155b, . . . , 155n−1, 155n that is transferred to DAC elements 130a, 130b, . . . , 130n through the barrel shifter 160.

The contents of any row of the binary to thermometer code conversion array 210 is determined by the formula:

$$\text{MENC}(X)=\text{THENC}(Y)+Q \qquad \text{Eq. 2}$$

Where:

$$X=Y+Q*N \qquad \text{Eq. 3}$$

MENC is contents of a row of the signed binary to thermometer code conversion array 210.

THENC is a one-bit (two level) thermometer encoder array as described in FIG. 3.

N is the number of DAC elements 130a, 130b, . . . , 130n.

X is the numeric designation of a row of the binary to thermometer code conversion array 210.

Q is the quotient of the non-Euclidian division of X by N where the remainder is Y has the same sign as X.

The binary to thermometer code conversion array 210 is assembled by repetitively executing the equation Eq. 2 for filling each row of the binary to thermometer code conversion array 210.

In various embodiments, the element binary strings of bits of the multi-bit thermometer code 155a, 155b, . . . , 155n−1, 155n of the binary to thermometer code conversion array 210 is transferred to a dynamic element matching circuit 160 to rotationally select the order that the DAC elements 130a, 130b, . . . , 130n are to receive each of the element binary strings of bits of the multi-bit thermometer code 155a, 155b, . . . , 155n−1, 155n.

In some embodiments, the dynamic element matching circuit 160 is a barrel shifter that serially rotates the order of the element binary strings of bits of the multi-bit thermometer code 155a, 155b, . . . , 155n−1, 155n presented to the DAC elements 130a, 130b, . . . , 130n to apply first order mismatch noise shaping to mitigate the mismatch errors associated to the random distribution of the gains of each individual multi-bit DAC elements 130a, 130b, . . . , 130n. In other embodiments, the dynamic element matching circuit 160 is implemented as a barrel shifter, dithered data weighted averaging circuit, incremental data weighted averaging circuit, bi-directional data weighted averaging circuit, partitioned data weighted averaging circuit, rotated data weighted averaging circuit, randomized data weighted averaging circuit, and pseudo data weighted averaging circuit, or any other rotational dynamic element matching circuits configured for reducing inherent data weighted averaging tonal behaviour.

In the embodiments, where the dynamic element matching circuit 160 is a barrel shifter, a pointer circuit 165 determines order that the multi-bit DAC elements 130a, 130b, . . . , 130n are selected for mitigating the effects of the differences in the layout design and manufacturing processes that cause the minor differences in the signal levels of each of the DAC elements 130a, 130b, . . . , 130n. In some embodiments, the pointer circuit operates with modulo N where N is the number of DAC elements 130a, 130b, . . . , 130n. To accomplish this, the oversampled binary code 115 is converted to a modulo N code to perform the calculation. The shifted element binary strings of bits of the multi-bit thermometer code 170a, 170b, . . . , 170n−1, 170n at the output of the barrel shifter 160 is applied to the inputs of the DAC elements 130a, 130b, . . . , 130n.

Figure 8:
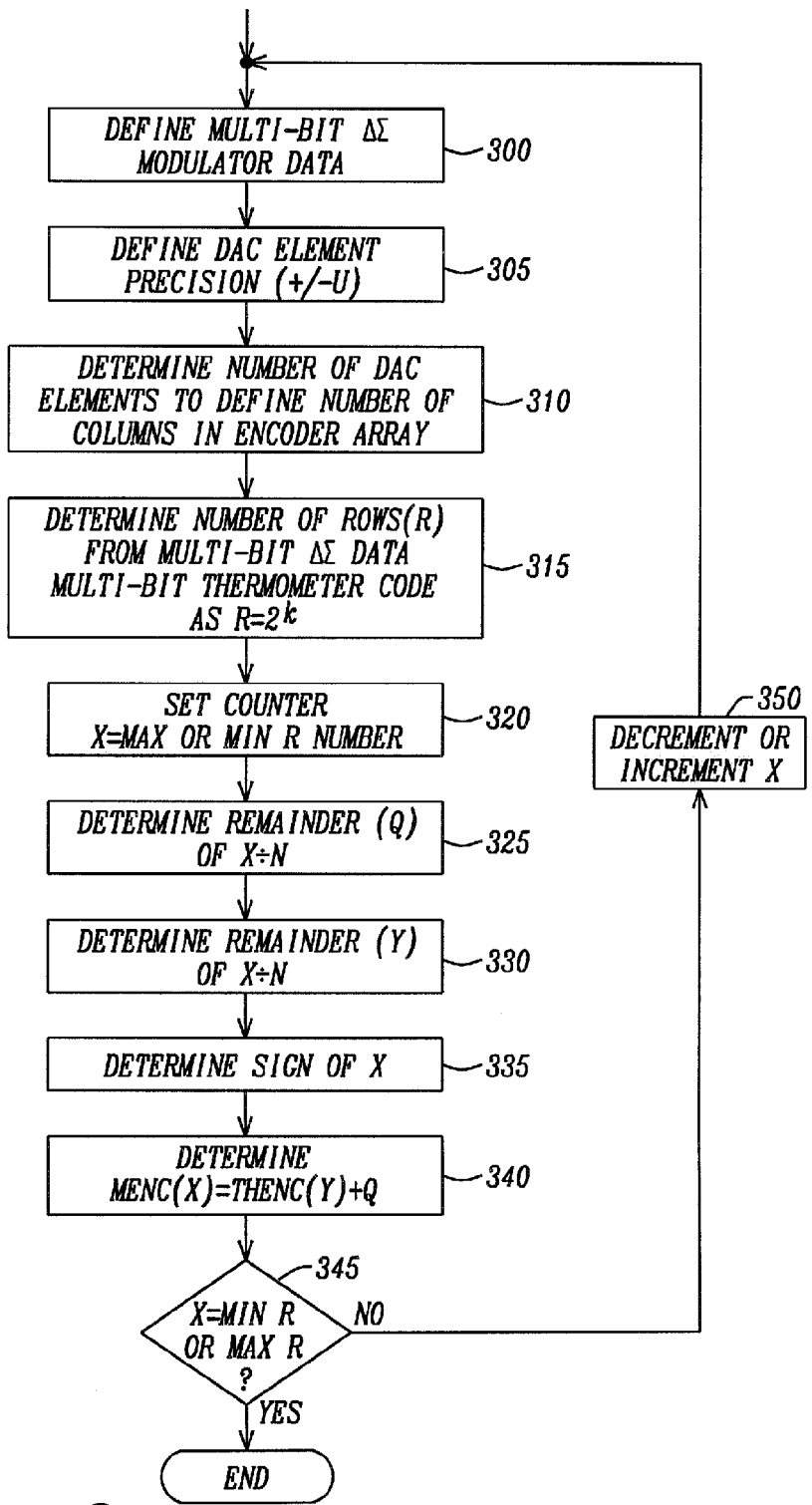
FIG. 8 is a flow chart illustrating the construction of a binary to thermometer code conversion array of the thermometer encoder of FIG. 7 embodying the principles of the present disclosure.

FIG. 8 is a flow chart illustrating the construction of a binary to thermometer code conversion array 210 of the thermometer encoder 150 of FIG. 7. Referring to FIGS. 7 and 8, the design of the binary to thermometer code conversion array 210 begins by defining (Box 300) the oversampled binary code 115 of the Delta/Sigma modulator 110. The oversampled binary code is based on the encoding format of the digital input 105 to the Delta/Sigma modulator 110, the oversampling rate of the Delta/Sigma modulator 110, and the number of output bits of the oversampled binary code 115.

The precision of each of the multi-bit DAC elements 130a, 130b, . . . , 130n is defined (Box 305). The maximum level being ±U such that the multi-bit thermometer code 155a, 155b, . . . , 155n−1, 155n has the number of bits equal to $m=\ln_2(2U+1)$ where U is the maximum level, positive and negative, of the DAC elements 130a, 130b, . . . , 130n. Based on the desired amplitude of the output of the DAC circuit and the increments of adjustment of the DAC circuit, the number N of DAC elements 130a, 130b, . . . , 130n is determined (Box 310).

The number of rows R of the binary to thermometer code conversion array 210 is determined (Box 315) as $R=2^k$, where k is the number of bits in the oversampled binary code 115. In order to establish the contents of the binary to thermometer code conversion array 210, a counter is initialized (Box 320). The order of filling each row is not critical and may be initialized at any convenient fashion, but for convenience, the counter could be set at either the maximum or minimum row number and decremented from the maximum or incremented from the minimum. The counter is designated X and is the signed numeric designation of a row of the binary to thermometer code conversion array 210. Since the value X of the counter represents the oversampled binary code 115 it has a signed (positive and negative) value.

The quotient Q is determined (Box 325) as the non-Euclidian division of X by N. In the non-Euclidian division of X by N, the remainder Y is determined (Box 330) and is established (Box 330) to have the same sign as the X. The contents of the Row are then determined (Box 340) by the equation Eq. 2. The value X of the counter is compared (Box 345) to the maximum or minimum value of the rows R. If the array has not been completed and the value X of the counter is not equal to the maximum or minimum value of the rows R, the value X of the counter is decremented if the starting value is the maximum value of R or incremented if the starting value is the minimum value of R (Box 350). The process is iterated until the value X is equal to the maximum value of R or the minimum value of R at which time the process is complete and the binary to thermometer code conversion array 210 is populated with the element binary strings of bits of the multi-bit thermometer code 155a, 155b, . . . , 155n−1, 155n that are to be transferred to the. DAC elements 130a, 130b, . . . , 130n through the barrel shifter 160

FIG. 9 is a table of a binary-to-thermometer encoding for a tri-level bit encoding. The three-level coding includes +1, 0, and −1 as the relative amplitude for the element binary strings of bits of the multi-bit thermometer code 170a, 170b, . . . , 170n−1, 170n. In this example, there are eight (8) DAC elements 130a, 130b, . . . , 130n. This constrains the oversampled binary code 115 to have a signed binary number that when decoded indicates seventeen levels (17). As shown above, the function for determining the number of levels is N*(L−1)+1. With there being eight DAC elements 130a, 130b, . . . , 130n with three levels each, the eight DAC elements 130a, 130b, . . . , 130n can determine the seventeen levels when the eight DAC elements 130a, 130b, . . . , 130n are additively combined.

The table is formed with the decoded levels oversampled binary code 115 of the Delta/Sigma modulator 110 indicating the rows of the table. Each column of the table is the element binary strings of bits of the multi-bit thermometer code 170a, 170b, . . . , 170n−1, 170n that is the input to the eight DAC elements 130a, 130b, . . . , 130n. The table is formed according to Eq. 2 where for instance, the indicated level is a 1 of the row of the binary to thermometer code conversion array 210 is found by:

MENC(1)=THENC(1)+Q

Where:
X is 1 based on Eq. 3.
Y is the remainder of the X/N or 1/8 or 1.
Q is the quotient of the X/N or 1/8 or 0.
Therefore, the MENC(1)=(1,0,0,0,0,0,0,0)+0=(1,0,0,0,0, 0,0,0)

A second example is where the indicated level of the indicated level is a −1 of the row of the thermometer encoder 150 of the binary to thermometer code conversion array 210 is found by:

MENC(−1)=THENC(−1)+Q

Where:
X is −1 based on Eq. 3.
Y is the remainder of the X/N or 1/8
Q is the quotient of the X/N or 1/8 or 0.

Therefore, the MENC(−1)=(0,0,0,0,0,0,0,−1)+0=(0,0,0,0, 0,0,0,−1).

In this instance the negative sign of THENC(Y) indicates that the one-bit (two level) thermometer encoder 150 of the binary to thermometer code conversion array 210 is inverted and rotated horizontally.

FIG. 10 is a table of a binary-to-thermometer encoding for a five level bit encoding. The five-level coding includes +2, +1, 0, −1 and −2 as the relative amplitude for the element binary strings of bits of the multi-bit thermometer code 170a, 170b, . . . , 170n−1, 170n. In this example, there are eight (8) DAC elements 130a, 130b, . . . , 130n. This constrains the oversampled binary code 115 to have a signed binary number that when decoded indicates thirty-three levels (33). As shown above, the function for determining the number of levels is N*(L−1)+1. With there being eight DAC elements 130a, 130b, . . . , 130n with five levels each, the eight DAC elements 130a, 130b, . . . , 130n can determine the thirty-three levels (33) when the eight DAC elements 130a, 130b, . . . , 130n are additively combined.

As in FIG. 7, the table is formed with the decoded levels of the oversampled binary code 115 of the Delta/Sigma modulator 110 indicating the rows of the table. Each column of the table is the element binary string of bits of the multi-bit thermometer code 170a, 170b, . . . , 170n−1, 170n that is the input to the eight DAC elements 130a, 130b, . . . , 130n. Each of the eight DAC elements 130a, 130b, . . . , 130n is able to provide 5 signal levels The table is formed according to Eq. 2 where for instance, the indicated level is a 11 of the row of the binary to thermometer code conversion array 210 is found by:

MENC(11)=THENC(3)+3

Where:
X is 1 based on Eq. 3
Y is the remainder of the X/N or 11/8=3
Q is the quotient of the X/N or 11/8=1.
Therefore, the MENC(11)=(1,1,1,0,0,0,0,0)+1=(2,2,2,1,1, 1,1,1)

A second example is where the indicated level of the indicated level is a −15 of the row of the thermometer encoder 150 of the binary to thermometer code conversion array 210 is found by:

MENC(−15)=THENC(−7)+−1

Where:
X is −15 based on Eq. 3
Y is the remainder of the X/N or −15/8=−7
Q is the quotient of the X/N or −15/8 or −1.
The MENC(−15)=(0,−1,−1,−1,−1,−1,−1,−1)+(−1)=(1,− 2,−2,−2,−2,−2,−2,−2).

Again in this instance, the negative sign of THENC(Y) indicates that the one-bit (two level) thermometer encoder 150 of the binary to thermometer code conversion array 210 is inverted and rotated horizontally.

It should be noted, that in forming each table, the equation Eq. 2 is repetitively executed as the amplitude values are incremented from the bottom of the table or decremented from the top of the table through the count of the values of the multi-bit thermometer code 155a, 155b, . . . , 155n−1, 155n.

Figure 11:
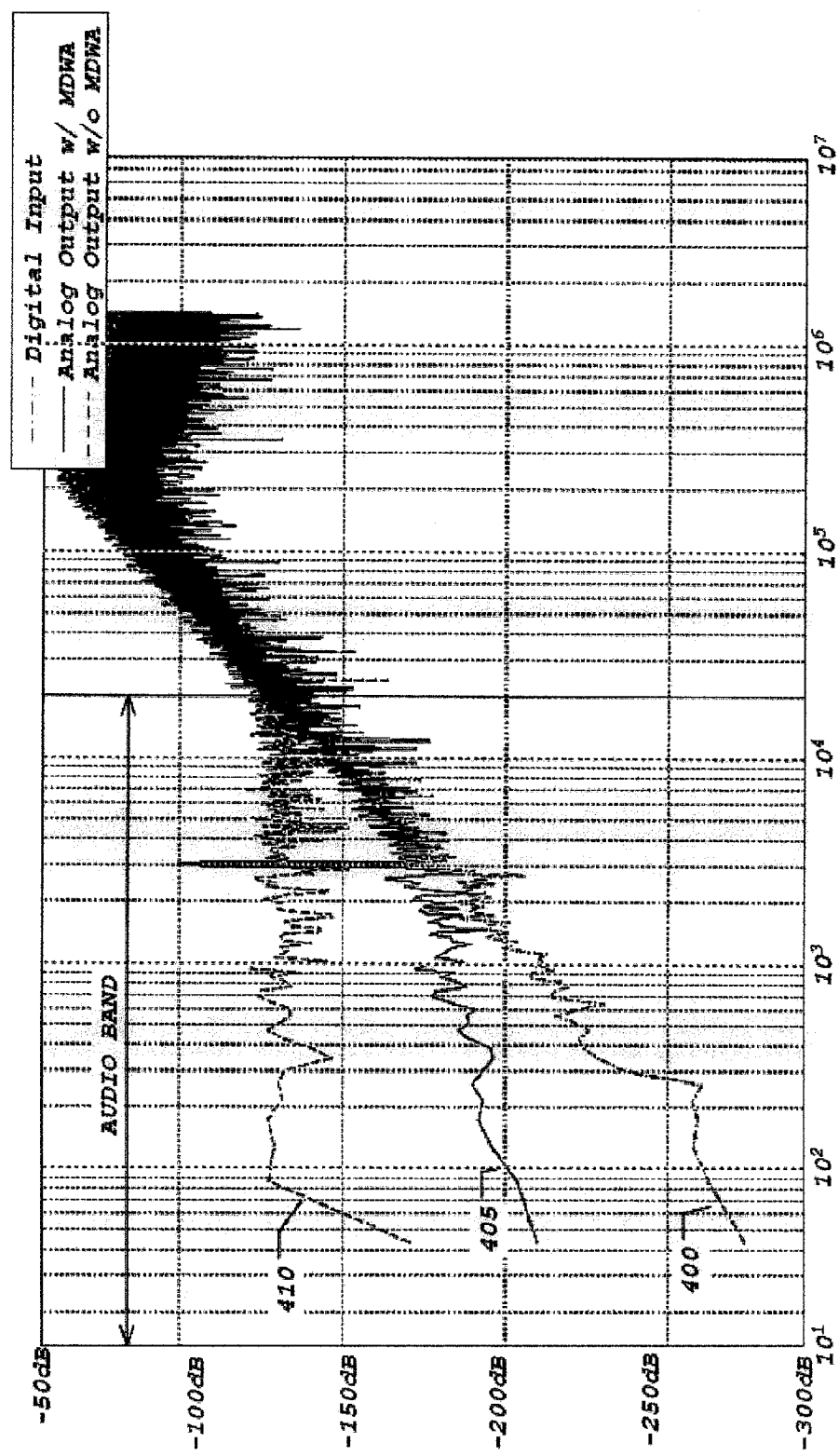
FIG. 11 is a plot of comparing the frequency spectrum structure of a Delta/Sigma DAC system having a multi-bit bit data weighted averaging circuit embodying the principles of the present disclosure and a Delta/Sigma DAC system having a multi-bit data weighted averaging circuit of the prior art with a small signal condition (−100 dBFS).

FIG. 11 is a plot of comparing the power spectral density of a Delta/Sigma DAC system having a multi-bit bit data weighted averaging circuit 120 embodying the principles of the present disclosure and a Delta/Sigma DAC system having a multi-bit data weighted averaging circuit of the prior art with a small signal condition (−100 dBFS). The most negative signal 400 is the power spectral density of the oversampled binary code 115 of the Delta/Sigma modulator 110. The next signal 405 is the power signal density of the analog output signal 140 from the summation circuit 135 including the multi-bit data thermometer encoder 150 having the binary to thermometer code conversion array 210. The most positive signal 410 is the power signal density of the analog output signal 140 from the summation circuit 135 without the multi-bit data thermometer encoder 150 having the binary to thermometer code conversion array 210.

In case of the signal 410 is the power signal density of the analog output signal 140 not including the binary to thermometer code conversion array 210 and in presence of mismatch between the DAC elements 130a, 130b, . . . , 130n (standard deviation=0.1%) the signal to noise ratio drops by 5 dB and mismatch errors are distributed uniformly in the audio band. This degradation increases as the mismatch increases.

In case of the signal 410 is the power signal density of the analog output signal 140 not including the binary to thermometer code conversion array 210 and in presence of the mismatch, the signal to noise ratio stays at the same level as the digital input resulting from the $1^{st}$ order mismatch error-shaping from the multi-bit data weighted averaging circuit 120.

Figure 12:
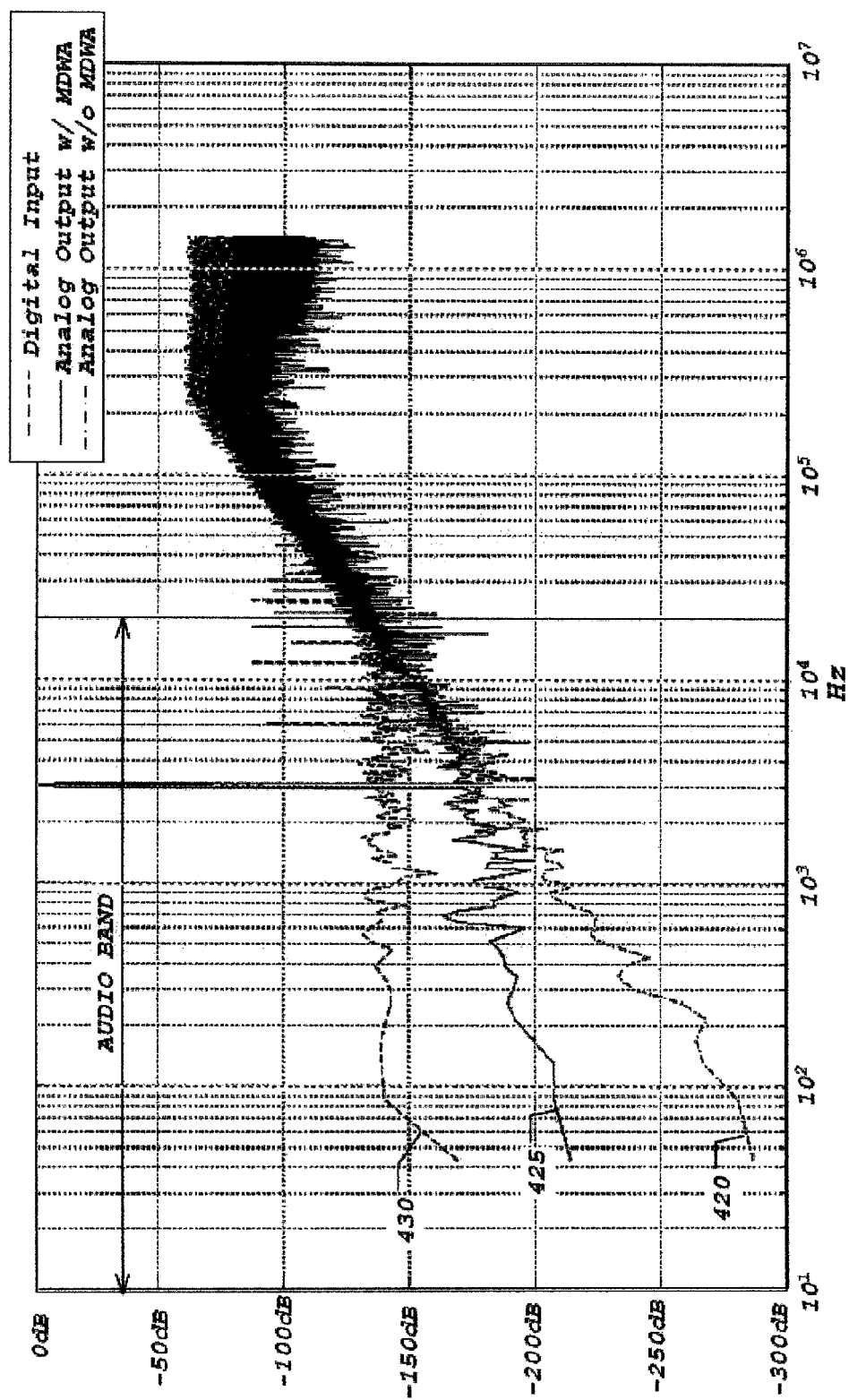
FIG. 12 is a plot of comparing the frequency spectrum structure of a Delta/Sigma DAC system having a multi-bit bit data weighted averaging circuit embodying the principles of the present disclosure and a Delta/Sigma DAC system having a multi-bit data weighted averaging circuit of the prior art with a large signal condition (−3 dBFS).

FIG. 12 is a plot of comparing the power spectral density of a Delta/Sigma DAC system having a multi-bit bit data weighted averaging circuit 120 embodying the principles of the present disclosure and a Delta/Sigma DAC system having a multi-bit data weighted averaging circuit of the prior art with a large signal condition (−3 dBFS). The most negative signal 420 is the power spectral density of the oversampled binary code 115 of the Delta/Sigma modulator 110. The next signal 425 is the power signal density of the analog output signal 140 from the summation circuit 135 including the multi-bit data thermometer encoder 150 having the binary to thermometer code conversion array 210. The most positive signal 430 is the power signal density of the analog output signal 140 from the summation circuit 135 without the multi-bit data thermometer encoder 150 having the binary to thermometer code conversion array 210.

In case of the signal 410 is the power signal density of the analog output signal 140 not including the binary to thermometer code conversion array 210 and in presence of mismatch between the DAC elements 130a, 130b, . . . 130n (standard deviation=0.1%), the total harmonic distortion plus noise (THD+N) drops from approximately 110 dB to approximately 82 dB representing a dramatic degradation of linearity performance.

In case of the signal 410 is the power signal density of the analog output signal 140 not including the binary to thermometer code conversion array 210 and in presence of the mismatch, the total harmonic distortion plus noise (THD+N) stays at approximately the same level as the digital input resulting from the $1^{st}$ order mismatch error-shaping from the multi-bit data weighted averaging circuit 120.

Figure 13:
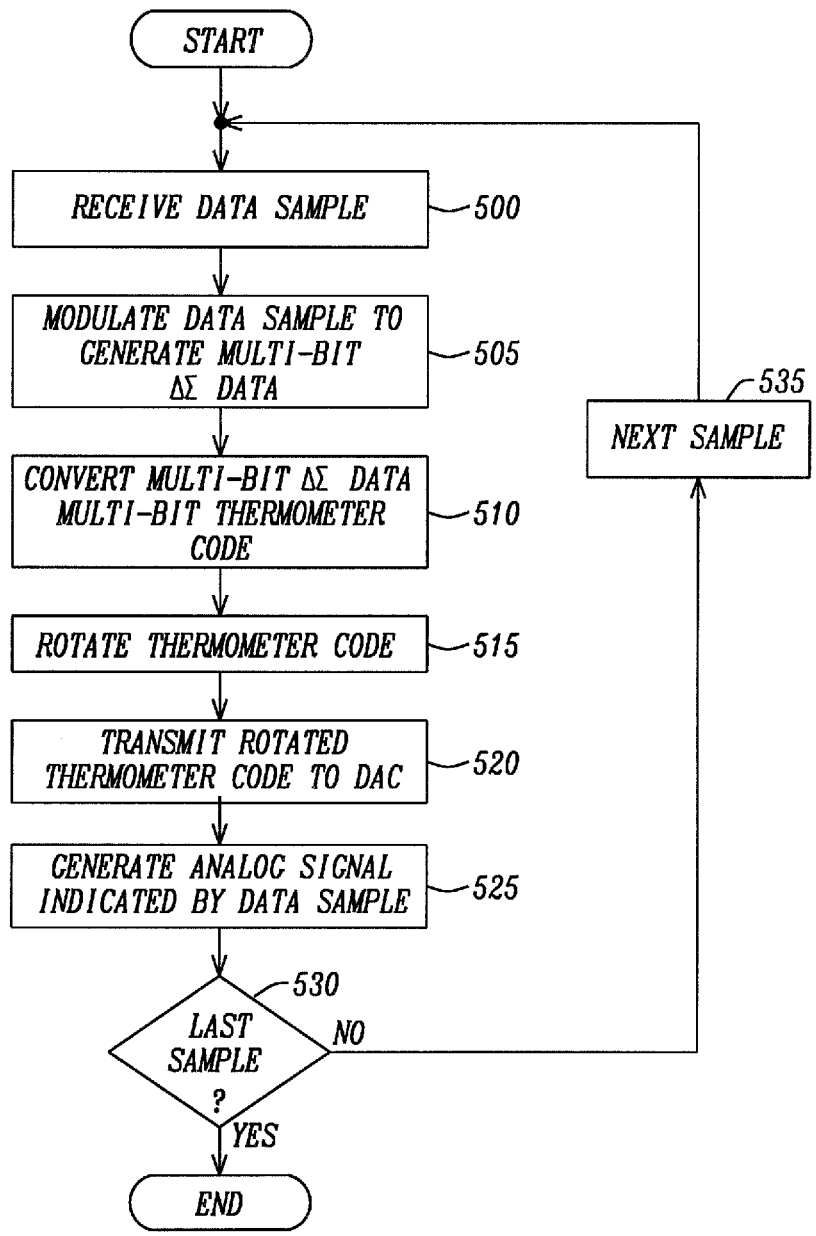
FIG. 13 is a flow chart illustrating a method for data weighted averaging binary data samples representing an analog signal during a digital-to-analog conversion embodying the principles of the present disclosure.

FIG. 13 is a flow chart illustrating a method for data weighted averaging binary data samples representing an analog signal during a digital-to-analog conversion embodying the principles of the present disclosure. The method begins, by receiving (Box 500) binary data samples representing an analog signal. The binary data samples are Delta/Sigma modulated (Box 505) by increasing the sampling frequency and then interpolating the values of the amplitude of the input signal between the two original sampling times to generate an oversampled binary code. The oversampled binary code is further converted to a multi-bit thermometer code. The conversion is accomplished by applying the oversampled binary code to a binary to thermometer encoder. The thermometer encoder includes a thermometer code conversion array that is configured as described above for FIG. 7.

The multi-bit thermometer code is then rotated (Box 515) to select which of the DAC elements to apply the thermometer code. In most embodiments, a barrel shifter is employed for the rotating (Box 515) for performing a rotational dynamic element matching to apply first order mismatch noise shaping to obviate the negative effects of mismatch errors such as noise and distortion between multiple digital-to-analog conversion elements. In various embodiments, rotating the multi-bit thermometer code is a barrel shifting of the multi-bit code elements, dithered data weighted averaging, an incremental data weighted averaging, a bi-directional data weighted averaging, a partitioned data weighted averaging, a rotated data weighted averaging, a randomized data weighted averaging, a pseudo data weighted averaging, or any other rotational dynamic element matching circuits configured for reducing inherent data weighted averaging tonal behaviour.

The rotated multi-bit thermometer code is then transferred (Box 520) to the selected DAC elements. The analog signals indicated by the multi-bit thermometer code are then additively combined to generate (Box 525) the analog signal indicated by the input data sample. The input signal is examined (Box 530) to determine if the last data sample has been received. If the last data sample has not been received, the next sample is staged (Box 535) to be received and the method is repeated for the next data sample. The method continues on each data sample until all data samples are received and the method is completed.

Figure 14:
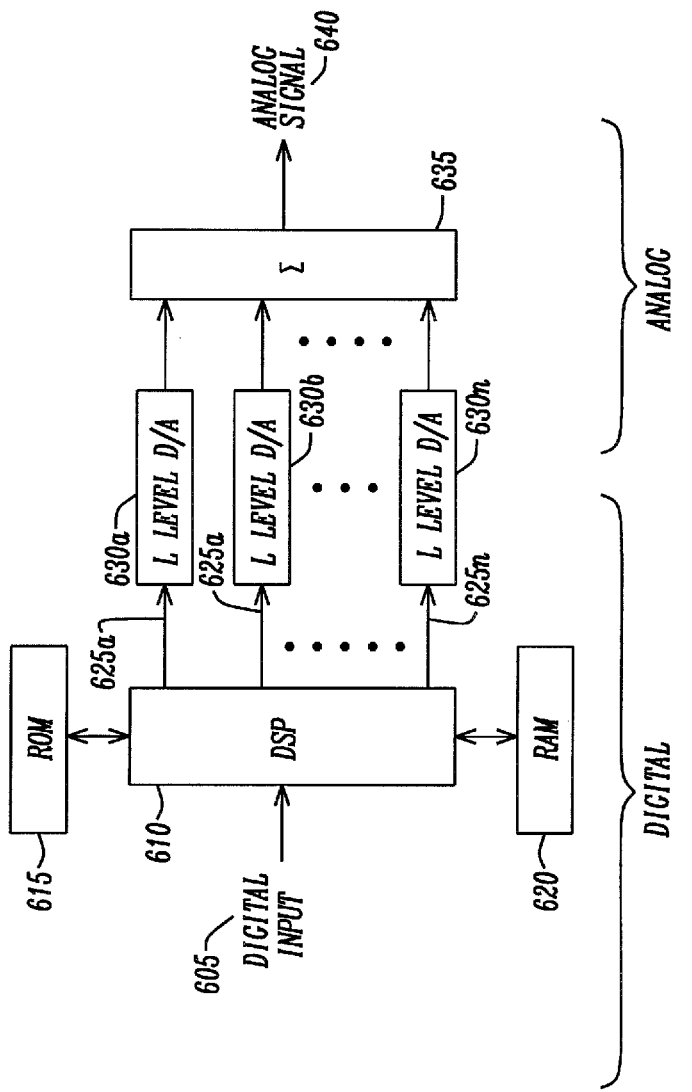
FIG. 14 is a block diagram of a Delta/Sigma DAC system employing a digital signal processor to execute the method of FIG. 13 for data weighted averaging binary data samples representing an analog signal during a digital-to-analog conversion embodying the principles of the present disclosure.

FIG. 14 is a block diagram of a Delta/Sigma DAC system employing a digital signal processor 610 to execute the method of FIG. 13 for data weighted averaging binary data samples representing an analog signal during a digital-to-analog conversion embodying the principles of the present disclosure. The method for data weighted averaging binary data samples representing an analog signal during a digital-to-analog conversion is implemented on a non-transitory computer processor readable medium such as a read-only-memory 615. The read-only-memory 615 stores a program of instructions for implementing the method of FIG. 13 for data weighted averaging binary data samples representing an analog signal during a digital-to-analog conversion as described in FIG. 13.

Digital input samples 605 are applied to the input of the digital signal processor 610 and the program instructions implementing the data weighted averaging binary data samples is executed by the digital signal processor 605. The digital signal processor performs the delta/sigma modulating (Box 505) by increasing the sampling frequency and then interpolating the values of the amplitude of the input signal between the two original sampling times to generate an oversampled binary code. The oversampled binary code is further converted to a multi-bit thermometer code. The conversion is accomplished by applying the oversampled binary code to a binary to thermometer encoding process. The thermometer encoding process addresses a thermometer code conversion array that is configured as described above for FIG. 7. In some embodiments, the thermometer code conversion array is stored in a random access memory 620 and may be modified as desired depending on the specifications for the digital-to-analog conversion.

The multi-bit thermometer code is then rotated (Box 515) to select which of the DAC elements to apply the thermometer code. In most embodiments, a barrel shifting process is employed for the rotating (Box 515) for performing a rotational dynamic element matching to apply first order mismatch noise shaping to obviate the negative effects of mismatch errors such as noise and distortion between multiple digital-to-analog conversion elements. In various embodiments, rotating the multi-bit thermometer code is a barrel shifting of the multi-bit code elements, dithered data weighted averaging, a incremental data weighted averaging, a bi-directional data weighted averaging, a partitioned data weighted averaging, a rotated data weighted averaging, a randomized data weighted averaging, a pseudo data weighted averaging, or any other rotational dynamic element matching circuits configured for reducing inherent data weighted averaging tonal behaviour.

The element binary string of bits of the multi-bit thermometer code 625a, 625b, ..., 625n−1, 625n is then transferred (Box 520) to the selected DAC elements 630a, 630b, ..., 630n. The analog signals indicated by the multi-bit thermometer code are then additively combined in the summation circuit 635 to generate (Box 525) the analog signal 640 indicated by the input data sample.

The thermometer code conversion array as retained in the random access memory 620 is configured according to equation Eq. 2 may be modified to realize different structures of the multi-bit thermometer code. The structure of the multi-bit thermometer code being dependent on the number of DAC elements 630a, 630b, ..., 630n and the number of levels of conversion that the DAC elements 630a, 630b, ..., 630n is designed to execute. Further, the multi-bit thermometer code is carried out based upon the number of bits within the Delta/Sigma modulated oversampled binary code.

While this disclosure has been particularly shown and described with reference to the preferred embodiments thereof, it will be understood by those skilled in the art that various changes in form and details may be made without departing from the spirit and scope of the disclosure.

What is claimed is:

1. A binary to thermometer encoder within a DAC circuit comprising:
    a row element selector in communication with a multi-bit delta/sigma modulator to receive an oversampled binary coding representing an amplitude of a sampling of an analog signal and configured for decoding the oversampled binary coding;
    a binary to thermometer code conversion array in communication with the row element selector to receive the decoded oversampled binary coding for selecting one element row of the binary to thermometer code conversion array and configured for retaining or generating a multi-bit code representing an amplitude to be developed by each of DAC element of the DAC circuit; and
    a plurality of column drivers configured such that each column is driver amplifies and conditions the output of each element of one selected row for transfer through a rotational dynamic element matching circuit to one DAC element;
    wherein contents of any row of the binary to thermometer code conversion array is determined as a product of each element of a signed binary to thermometer code conversion array and a remainder of an non-Euclidian division of the signed numeric designation of one row of a signed binary to thermometer code conversion array by a number of DAC elements within the DAC circuit and added to the quotient of the non-Euclidian division, wherein the remainder has the same sign as the numeric designation of the one row; and
    wherein, the binary to thermometer code conversion array is assembled by repetitively executing the formula for determining the contents of the rows of the binary to thermometer code conversion array.

2. The binary to thermometer encoder of claim 1 wherein contents of any row of the binary to thermometer code conversion array is determined by the formula:

$$MENC(X)=THENC(Y)+Q$$

where:

$$X=Y+Q*N$$

MENC is contents of one row of the signed binary to thermometer code conversion array,
THENC is a one-bit (two level) thermometer encoder array,
N is the number of DAC elements,
X is the numeric designation of one row of the binary to thermometer code conversion array,
Q is the quotient of the non-Euclidian division of X by N where the remainder is Y has the same sign as X.

3. The binary to thermometer encoder of claim 1 wherein the oversampled binary coding is structured to have sufficient bits to select a primary dimension of the array having a number of elements determined by the formula:

$$C=m*N*2^k$$

where:
m is the number of bits in each binary word,
N is the number of the DAC elements,
k is the number of bits of the output of the Delta/Sigma modulator.

4. The binary to thermometer encoder of claim 1 wherein the number of outputs of the multi-bit thermometer encoder is equal to the number of DAC elements of the DAC circuit and each of the inputs to each DAC element receives a number of bits within the element binary strings.

5. The binary to thermometer encoder of claim 1 wherein the binary to thermometer code conversion array are memory cells retaining the value for each of the binary word in each of the rows of the row decoder.

6. The binary to thermometer encoder of claim 5 wherein the binary to thermometer code conversion array is formed of a static random access memory, a read-only memory array, or a programmable read only array.

7. The binary to thermometer encoder of claim 1 wherein the binary to thermometer code conversion array is formed of logic fulfilling the logic function to define the levels for each cell.

8. A DAC circuit comprising:
    a multi-bit Delta/Sigma modulator that receives a binary code representative of the amplitude of a sampled analog signal, and configured for increasing the sampling frequency of the binary code and interpolating each sample of the oversampled frequency based on the values of the original sampled data, and converting the oversampled and interpolated data to an oversampled coding and
    a binary to thermometer encoder comprising:
        a row element selector in communication with a multi-bit delta/sigma modulator to receive an oversampled binary coding representing an amplitude of a sampling of an analog signal and configured for decoding the oversampled binary coding,
        a binary to thermometer code conversion array in communication with the row element selector to receive the decoded oversampled binary coding for selecting one element row of the binary to thermometer code conversion array and configured for retaining or generating a multi-bit code element representing an amplitude to be developed by the DAC circuit, a plurality of column drivers configured such that each column is driver amplifies and conditions the output of each multi-bit code element of one selected row; and a plurality of DAC elements in communication with the binary to thermometer encoder and configured such that each element of one selected element row of the binary to thermometer code conversion array is received by one DAC element and converted to an analog signal having an amplitude determined by the multi-bit code element;

wherein contents of any row of the binary to thermometer code conversion array is determined as a product of each element of a signed binary to thermometer code conversion array and a remainder of an non-Euclidian division of the signed numeric designation of one row of a signed binary to thermometer code conversion array by a number of DAC elements within the DAC circuit and added to the quotient of the non-Euclidian division, wherein the remainder has the same sign as the numeric designation of the one row; and wherein, the binary to thermometer code conversion array is assembled by repetitively executing the formula for determining the contents of the rows of the binary to thermometer code conversion array.

9. The DAC circuit of claim 8 wherein contents of any row of the binary to thermometer code conversion array is determined by the formula:

$$MENC(X)=THENC(Y)+Q$$

where:

$$X=Y+Q*N$$

MENC is contents of one row of the signed binary to thermometer code conversion array, THENC is a one-bit (two level) thermometer encoder array, N is the number of DAC elements, X is the numeric designation of one row of the binary to thermometer code conversion array, Q is the quotient of the non-Euclidian division of X by N where the remainder is Y has the same sign as X.

10. The DAC circuit of claim 8 further comprising a rotational dynamic element matching circuit in communication with the binary to thermometer encoder to receive the multi-bit code elements from the columns of the binary to thermometer code conversion array and configured for rotating the multi-bit code elements and transferring each of the multi-bit code elements to the selected DAC elements for mitigating the effects of the differences in the layout design and manufacturing processes that cause minor differences in the signal levels of each of the DAC elements.

11. The DAC circuit of claim 10 wherein the rotational dynamic element matching circuit comprises:

a pointer generator configured for generating a rotation pointer indicating where each of the each of the multi-bit code elements of the multi-bit thermometer code should be rotated during the next clock cycle; and a shifter connected to the pointer generator for receiving the rotation pointer and configured for rotating each multi-bit code elements of the multi-bit thermometer code to the proper position based on shifting of the previous oversampled binary code.

12. The DAC circuit of claim 10 wherein the rotational dynamic element matching circuit is a barrel shifter, dithered data weighted averaging circuit, incremental data weighted averaging circuit, bi-directional data weighted averaging circuit, partitioned data weighted averaging circuit, rotated data weighted averaging circuit, randomized data weighted averaging circuit, and pseudo data weighted averaging circuit, or any other rotational dynamic element matching circuits configured for reducing inherent data weighted averaging tonal behaviour.

13. The DAC circuit of claim 8 wherein the oversampled binary coding is structured to have sufficient bits to select a primary dimension of the array having a number of elements determined by the formula:

$$C=m*N*2^k$$

where:

m is the number of bits in each binary word,

N is the number of the DAC elements, k is the number of bits of the output of the Delta/Sigma modulator.

14. The DAC circuit of claim 8 wherein the number of outputs of the multi-bit thermometer encoder is equal to the number of DAC elements of the DAC circuit and each of the inputs to each DAC element receives a number of bits within the element binary strings.

15. The DAC circuit of claim 8 wherein the binary to thermometer code conversion array are memory cells retaining the value for each of the binary word in each of the rows of the row decoder.

16. The DAC circuit of claim 15 wherein the binary to thermometer code conversion array is formed of a static random access memory, a read-only memory array, or a programmable read only array.

17. The DAC circuit of claim 8 wherein the binary to thermometer code conversion array is formed of logic fulfilling the logic function to define the levels for each cell.

18. A data weighted averaging circuit within a DAC circuit comprising a binary to thermometer encoder comprising:

a row element selector in communication with a multi-bit delta/sigma modulator to receive an oversampled binary coding representing an amplitude of a sampling of an analog signal and configured for decoding the oversampled binary coding;

a binary to thermometer code conversion array in communication with the row element selector to receive the decoded oversampled binary coding for selecting one element row of the binary to thermometer code conversion array and configured for retaining or generating a multi-bit code representing an amplitude to be developed by each of DAC element of the DAC circuit; and a plurality of column drivers configured such that each column is driver amplifies and conditions the output of each element of one selected row for transfer through a rotational dynamic element matching circuit to one DAC element;

wherein contents of any row of the binary to thermometer code conversion array is determined as a product of each element of a signed binary to thermometer code conversion array and a remainder of an non-Euclidian division of the signed numeric designation of one row of a signed binary to thermometer code conversion array by a number of DAC elements within the DAC circuit and added to the quotient of the non-Euclidian division, wherein the remainder has the same sign as the numeric designation of the one row; and a rotational dynamic element matching circuit in communication with the binary to thermometer encoder to receive the multi-bit code elements from the columns of the binary to thermometer code conversion array and configured for rotating the multi-bit code elements and transferring each of the multi-bit code elements to the selected DAC elements for mitigating the effects of the differences in the layout design and manufacturing processes that cause minor differences in the signal levels of each of the DAC elements;

wherein, the binary to thermometer code conversion array is assembled by repetitively executing the formula for determining the contents of the rows of the binary to thermometer code conversion array.

19. The data weighted averaging circuit of claim 18 wherein contents of any row of the binary to thermometer code conversion array is determined by the formula:

$$MENC(X)=THENC(Y)+Q$$

where:

$$X=Y+Q*N$$

MENC is contents of one row of the signed binary to thermometer code conversion array, THENC is a one-bit (two level) thermometer encoder array, N is the number of DAC elements, X is the numeric designation of one row of the binary to thermometer code conversion array, Q is the quotient of the non-Euclidian division of X by N where the remainder is Y has the same sign as X.

20. The data weighted averaging circuit of claim 18 wherein the rotational dynamic element matching circuit comprises:

a pointer generator configured for generating a rotation pointer indicating where each of the each of the multi-bit code elements of the multi-bit thermometer code should be rotated during the next clock cycle; and a shifter connected to the pointer generator for receiving the rotation pointer and configured for rotating each multi-bit code elements of the multi-bit thermometer code to the proper position based on shifting of the previous oversampled binary code.

21. The data weighted averaging circuit of claim 18 wherein the rotational dynamic element matching circuit is a barrel shifter circuit, a dithered data weighted averaging circuit, a incremental data weighted averaging, a bi-directional data weighted averaging circuit, a partitioned data weighted averaging circuit, a rotated data weighted averaging circuit, a randomized data weighted averaging circuit, and a pseudo data weighted averaging circuit, or any other rotational dynamic element matching circuits configured for reducing inherent data weighted averaging tonal behaviour.

22. The data weighted averaging circuit of claim 21 wherein the oversampled binary coding is structured to have sufficient bits to select a primary dimension of the array having a number of elements determined by the formula:

$$C=m*N*2^k$$

where:

m is the number of bits in each binary word,

N is the number of the DAC elements, k is the number of bits of the output of the Delta/Sigma modulator.

23. The data weighted averaging circuit of claim 18 wherein the number of outputs of the multi-bit thermometer encoder is equal to the number of DAC elements of the DAC circuit and each of the inputs to each DAC element receives a number of bits within the element binary strings.

24. The data weighted averaging circuit of claim 18 wherein the binary to thermometer code conversion array are memory cells retaining the value for each of the binary word in each of the rows of the row decoder.

25. The data weighted averaging circuit of claim 21 wherein the binary to thermometer code conversion array is formed of a static random access memory, a read-only memory array, or a programmable read only array.

26. The data weighted averaging circuit of claim 18 wherein the binary to thermometer code conversion array is formed of logic fulfilling the logic function to define the levels for each cell.

27. A method for data weighted averaging binary data samples representing an analog signal during a digital-to-analog conversion comprising the steps of:

delta/sigma modulating a binary code representative of the amplitude of a sampled analog signal by increasing the sampling frequency of the binary code, interpolating each data sample of the oversampled data based on the values of the original sampled data, truncating the number of bits of oversampled binary data and converting the oversampled binary data to a multi-bit thermometer code;

converting the oversampled binary data to the multi-bit thermometer code by the steps of:

applying the oversampled binary data to a binary to thermometer code conversion table having one dimension of the table defined by the range of the oversampled binary data and a second dimension of the table defined by the number of digital-to-analog conversion elements, wherein the number of levels of conversion that the digital-to-analog conversion elements perform defines a modulus of the conversion, and selecting one row of the conversion table populated with multi-bit code elements of the multi-bit thermometer code;

selecting digital-to-analog conversion elements for receiving the multi-bit code elements of the multi-bit thermometer code;

rotating the multi-bit code elements of the multi-bit thermometer code such that the multi-bit code elements of the multi-bit thermometer code are applied to the selected digital-to-analog conversion elements to perform a rotational dynamic element matching to apply first order mismatch noise shaping to obviate the negative effects of mismatch errors such as noise and distortion between multiple digital-to-analog conversion elements; and transferring the rotated multi-bit thermometer code to the digital-to-analog conversion elements to generate the analog signal indicated by the data sample.

28. The method for data weighted averaging binary data samples of claim 27 wherein contents of any row of the binary to thermometer code conversion table are determined as a product of each element of a signed binary to thermometer code conversion array and a remainder of an non-Euclidian division of the signed numeric designation of one row of a signed binary to thermometer code conversion array by a number of DAC elements within the DAC circuit and added to the quotient of the non-Euclidian division, wherein the remainder has the same sign as the numeric designation of the one row.

29. The method for data weighted averaging binary data samples of claim 28 wherein determining contents of any row of the binary to thermometer code conversion array implemented by the formula:

$$MENC(X)=THENC(Y)+Q$$

where:

$$X=Y+Q*N$$

MENC is contents of one row of the signed binary to thermometer code conversion array,
THENC is a one-bit (two level) thermometer encoder array,
N is the number of DAC elements,
X is the numeric designation of one row of the binary to thermometer code conversion array,
Q is the quotient of the non-Euclidian division of X by N where the remainder is Y has the same sign as X.

30. The method for data weighted averaging binary data samples of claim 27 wherein the rotating the multi-bit code elements of the multi-bit thermometer code comprises the steps of:
generating a rotation pointer indicating where each of the each of the multi-bit code elements of the multi-bit thermometer code should be rotated during the next clock cycle; and
rotating each multi-bit code elements of the multi-bit thermometer code to the proper position based on shifting of the previous oversampled binary code that generates the rotation pointer.

31. The method for data weighted averaging binary data samples of claim 27 wherein the rotating the multi-bit code elements of the multi-bit thermometer code is a barrel shifting of the multi-bit code elements dithered data weighted averaging, a incremental data weighted averaging, a bi-directional data weighted averaging, a partitioned data weighted averaging, a rotated data weighted averaging, a randomized data weighted averaging, and a pseudo data weighted averaging, or any other rotational dynamic element matching circuits configured for reducing inherent data weighted averaging tonal behaviour.

32. The method for data weighted averaging binary data samples of claim 27 rotating the multi-bit code elements of the multi-bit thermometer code wherein the oversampled binary coding is structured to have sufficient bits to select a primary dimension of the conversion table having a number of elements determined by the formula:

$$C=m*N*2^k$$

where:
m is the number of bits in each binary word,
N is the number of the digital-to-analog conversion elements,
k is the number of bits of the output of the Delta/Sigma modulator.

33. The method for data weighted averaging binary data samples of claim 27 wherein the number of outputs of the conversion table is equal to the number of digital-to-analog conversion elements and each of the inputs to each digital-to-analog conversion elements receives a number of bits within the element binary strings.

34. The method for data weighted averaging binary data samples of claim 27 wherein the binary to thermometer code conversion table is an array of memory cells retaining the value for each of the binary word in each of the rows of the conversion table.

35. The method for data weighted averaging binary data samples of claim 27 wherein the binary to thermometer code conversion table is formed of a static random access memory, a read-only memory array, or a programmable read only array.

36. The method for data weighted averaging binary data samples of claim 27 wherein the binary to thermometer code conversion table is formed of logic fulfilling the logic function to define the levels for each cell.

37. A design structure embodied in a machine readable medium used in a design process, the design structure comprising:
a binary to thermometer encoder within a DAC circuit comprising:
a row element selector in communication with a multi-bit delta/sigma modulator to receive an oversampled binary coding representing an amplitude of a sampling of an analog signal and configured for decoding the oversampled binary coding;
a binary to thermometer code conversion array in communication with the row element selector to receive the decoded oversampled binary coding for selecting one element row of the binary to thermometer code conversion array and configured for retaining or generating a multi-bit code representing an amplitude to be developed by each of DAC element of the DAC circuit;
a plurality of column drivers configured such that each column is driver amplifies and conditions the output of each element of one selected row for transfer through a rotational dynamic element matching circuit to one DAC element; and
wherein contents of any row of the binary to thermometer code conversion array is determined as a product of each element of a signed binary to thermometer code conversion array and a remainder of an non-Euclidian division of the signed numeric designation of one row of a signed binary to thermometer code conversion array by a number of DAC elements within the DAC circuit and added to the quotient of the non-Euclidian division, wherein the remainder has the same sign as the numeric designation of the one row; and
wherein, the binary to thermometer code conversion array is assembled by repetitively executing the formula for determining the contents of the rows of the binary to thermometer code conversion array.

38. The design structure of claim 37 wherein contents of any row of the binary to thermometer code conversion array is determined by the formula:

$$MENC(X)=THENC(Y)+Q$$

where:

$$X=Y+Q*N$$

MENC is contents of one row of the signed binary to thermometer code conversion array,
THENC is a one-bit (two level) thermometer encoder array,
N is the number of DAC elements,
X is the numeric designation of one row of the binary to thermometer code conversion array,
Q is the quotient of the non-Euclidian division of X by N where the remainder is Y has the same sign as X.

39. The design structure of claim 37 wherein the oversampled binary coding is structured to have sufficient bits to select a primary dimension of the conversion array having a number of elements determined by the formula:

$$C = m*N*2^k$$

where:
m is the number of bits in each binary word,
N is the number of the DAC elements,
k is the number of bits of the output of the Delta/Sigma modulator.

40. The design structure of claim 37 wherein the number of outputs of the multi-bit thermometer encoder is equal to the number of DAC elements of the DAC circuit and each of the inputs to each DAC element receives a number of bits within the element binary strings.

41. The design structure of claim 37 wherein the binary to thermometer code conversion array are memory cells retaining the value for each of the binary word in each of the rows of the row decoder.

42. The design structure of claim 41 wherein the binary to thermometer code conversion array is formed of a static random access memory, a read-only memory array, or a programmable read only array.

43. The design structure of claim 37 wherein the binary to thermometer code conversion array is formed of logic fulfilling the logic function to define the levels for each cell.

44. A non-transitory computer processor readable medium having stored thereon a program of instructions executable by the computer processor to perform a method for data weighted averaging binary data samples representing an analog signal during a digital-to-analog conversion comprising the steps of:
  delta/sigma modulating a binary code representative of the amplitude of a sampled analog signal by increasing the sampling frequency of the binary code, interpolating each data sample of the oversampled data based on the values of the original sampled data, truncating the number of bits of oversampled binary data and converting the oversampled binary data to a multi-bit thermometer code;
  converting the oversampled binary data to the multi-bit thermometer code by the steps of:
    applying the oversampled binary data to a binary to thermometer code conversion table having one dimension of the table defined by the range of the oversampled binary data and a second dimension of the table defined by the number of digital-to-analog conversion elements, wherein the number of levels of conversion that the digital-to-analog conversion elements perform defines a modulus of the conversion, and
    selecting one row of the conversion table populated with multi-bit code elements of the multi-bit thermometer code;
  selecting digital-to-analog conversion elements for receiving the multi-bit code elements of the multi-bit thermometer code;
  rotating the multi-bit code elements of the multi-bit thermometer code such that the multi-bit code elements of the multi-bit thermometer code are applied to the selected digital-to-analog conversion elements to perform a rotational dynamic element matching to apply first order mismatch noise shaping to obviate the negative effects of mismatch errors such as noise and distortion between multiple digital-to-analog conversion elements; and
  transferring the rotated multi-bit thermometer code to the digital-to-analog conversion elements to generate the analog signal indicated by the data sample.

45. The non-transitory computer processor readable medium of claim 44 wherein contents of any row of the binary to thermometer code conversion table are determined as a product of each element of a signed binary to thermometer code conversion array and a remainder of an non-Euclidian division of the signed numeric designation of one row of a signed binary to thermometer code conversion array by a number of DAC elements within the DAC circuit and added to the quotient of the non-Euclidian division, wherein the remainder has the same sign as the numeric designation of the one row.

46. The non-transitory computer processor readable medium of claim 45 wherein determining contents of any row of the binary to thermometer code conversion array implemented by the formula:

$$MENC(X) = THENC(Y) + Q$$

where:

$$X = Y + Q*N$$

MENC is contents of one row of the signed binary to thermometer code conversion array,
THENC is a one-bit (two level) thermometer encoder array,
N is the number of DAC elements,
X is the numeric designation of one row of the binary to thermometer code conversion array,
Q is the quotient of the non-Euclidian division of X by N where the remainder is Y has the same sign as X.

47. The non-transitory computer processor readable medium of claim 44 wherein the rotating the multi-bit code elements of the multi-bit thermometer code comprises the steps of:
  generating a rotation pointer indicating where each of the each of the multi-bit code elements of the multi-bit thermometer code should be rotated during the next clock cycle; and
  rotating each multi-bit code elements of the multi-bit thermometer code to the proper position based on shifting of the previous oversampled binary code that generates the rotation pointer.

48. The non-transitory computer processor readable medium of claim 44 wherein the rotating the multi-bit code elements of the multi-bit thermometer code is a barrel shifting of the multi-bit code elements, a dithered data weighted averaging, a incremental data weighted averaging, a bi-directional data weighted averaging, a partitioned data weighted averaging, a rotated data weighted averaging, a randomized data weighted averaging, and a pseudo data weighted averaging, or any other rotational dynamic element matching circuits configured for reducing inherent data weighted averaging tonal behaviour.

49. The non-transitory computer processor readable medium of claim 44 wherein the oversampled binary coding is structured to have sufficient bits to select a primary dimension of the conversion table having a number of elements determined by the formula:

$$C = m\,N*2^k$$

where:
m is the number of bits in each binary word,
N is the number of the digital-to-analog conversion elements, k is the number of bits of the output of the Delta/Sigma modulator.

50. The non-transitory computer processor readable medium of claim 44 wherein the number of outputs of the conversion table is equal to the number of digital-to-analog conversion elements and each of the inputs to each digital-to-analog conversion elements receives a number of bits within the element binary strings.

51. The non-transitory computer processor readable medium of claim 44 wherein the binary to thermometer code conversion table is an array of memory cells retaining the value for each of the binary word in each of the rows of the conversion table.

52. The non-transitory computer processor readable medium of claim 51 wherein the binary to thermometer code conversion table is formed of a static random access memory, a read-only memory array, or a programmable read only array.

53. The non-transitory computer processor readable medium of claim 44 wherein the binary to thermometer code conversion table is formed of logic fulfilling the logic function to define the levels for each cell.

\* \* \* \* \*